(12) United States Patent
Lee (10) Patent No.: US 11,255,915 B2
(45) Date of Patent: Feb. 22, 2022

(54) SWITCH CONTROL APPARATUS AND METHOD

(71) Applicant: LG Energy Solution, Ltd., Seoul (KR)

(72) Inventor: Gyu-Yeol Lee, Daejeon (KR)

(73) Assignee: LG Energy Solution, Ltd.

( * ) Notice: Subject to any disclaimer, the term of this patent is extended or adjusted under 35 U.S.C. 154(b) by 0 days.

(21) Appl. No.: 17/042,999

(22) PCT Filed: Nov. 29, 2019

(86) PCT No.: PCT/KR2019/016802
§ 371 (c)(1),
(2) Date: Sep. 29, 2020

(87) PCT Pub. No.: WO2020/111899
PCT Pub. Date: Jun. 4, 2020

(65) Prior Publication Data
US 2021/0011085 A1  Jan. 14, 2021

(30) Foreign Application Priority Data

Nov. 30, 2018 (KR) .......................... 10-2018-0152785

(51) Int. Cl.
*G01R 31/327* (2006.01)
*G01R 31/396* (2019.01)
(Continued)

(52) U.S. Cl.
CPC ....... *G01R 31/3278* (2013.01); *G01R 19/165* (2013.01); *G01R 31/388* (2019.01);
(Continued)

(58) Field of Classification Search
CPC ......................... G01R 31/3278; G01R 31/396; G01R 31/388; G01R 19/165; G01R 31/327; G01R 31/3274; H01M 10/48; H01M 10/4285
See application file for complete search history.

(56) References Cited

U.S. PATENT DOCUMENTS 6,882,155 B2   4/2005  Lazzaro
9,939,491 B2   4/2018  Fukumoto et al.
(Continued)

FOREIGN PATENT DOCUMENTS

JP   H11051661 A   2/1999
JP   2004293733 A  10/2004
(Continued)

OTHER PUBLICATIONS

Sravanthi, Srikantam, A Method for Online Diagnostics of Electromagnetic Relays Against Contact Welding for Safety Critical Applications, Dec. 2015, IEEE vol. 5 No. 12 (Year: 2015).*
(Continued)

*Primary Examiner* — Son T Le
*Assistant Examiner* — Dustin R Dickinson
(74) *Attorney, Agent, or Firm* — Lerner, David, Littenberg, Krumholz & Mentlik, LLP (57) ABSTRACT

A switch control apparatus and method to diagnose whether a plurality of switches are controllable and effectively control the plurality of switches. According to an aspect of the present disclosure, it is possible to effectively maintain the states of the switches through a plurality of processors.

13 Claims, 3 Drawing Sheets

(51) Int. Cl.
  *G01R 31/388* (2019.01)
  *G01R 19/165* (2006.01)
  *H01M 10/42* (2006.01)
  *H01M 10/48* (2006.01)

(52) U.S. Cl.
  CPC ...... *G01R 31/396* (2019.01); *H01M 10/4285* (2013.01); *H01M 10/48* (2013.01)

(56) References Cited

U.S. PATENT DOCUMENTS

| | | |
|---|---|---|
| 2006/0259209 A1 | 11/2006 | Sugimura |
| 2008/0143298 A1 | 6/2008 | Yoshida |
| 2014/0159908 A1 | 6/2014 | Hong et al. |
| 2015/0054516 A1* | 2/2015 | Iisaka ................ B60L 3/12 324/418 |
| 2015/0222205 A1 | 8/2015 | Suda |
| 2018/0102229 A1 | 4/2018 | Oppermann et al. |
| 2018/0113170 A1 | 4/2018 | Liu et al. |
| 2018/0188326 A1 | 7/2018 | Huh et al. |
| 2018/0254624 A1* | 9/2018 | Son ................ H02H 9/001 |

FOREIGN PATENT DOCUMENTS

| | | |
|---|---|---|
| JP | 2008175804 A | 7/2008 |
| JP | 2012205410 A | 10/2012 |
| JP | 2015147261 A | 8/2015 |
| JP | 2016193632 A | 11/2016 |
| KR | 20040037811 A | 5/2004 |
| KR | 100840060 B1 | 6/2008 |
| KR | 20130101247 A | 9/2013 |
| KR | 20130110066 A | 10/2013 |
| KR | 101539692 B1 | 7/2015 |

OTHER PUBLICATIONS

International Search Report for PCT/KR2019/016802 dated Mar. 23, 2020; 2 pages.
Extended Eurropean Search Report for Application No. 19889199.6, dated Sep. 7, 2021, 6 pages.

* cited by examiner

SWITCH CONTROL APPARATUS AND METHOD

CROSS-REFERENCE TO RELATED APPLICATIONS

The present application is a national phase entry under 35 U.S.C. § 371 of International Application No. PCT/KR2019/016802 filed Nov. 29, 2019, published in Korean, which claims priority from Korean Patent Application No. 10-2018-0152785 filed Nov. 30, 2018, all of which are incorporated herein by reference.

TECHNICAL FIELD

The present application claims priority to Korean Patent Application No. 10-2018-0152785 filed on Nov. 30, 2018 in the Republic of Korea, the disclosures of which are incorporated herein by reference.

The present disclosure relates to a switch control apparatus and method, and more particularly, to a switch control apparatus and method capable of effectively controlling a switch during a process of controlling a plurality of switches.

BACKGROUND ART

In recent years, the demand for portable electronic products such as notebook computers, video cameras and portable phones has increased sharply, and the energy storage batteries, robots and satellites has been active developed. Accordingly, high-performance secondary batteries allowing repeated charging and discharging are being actively studied.

Accordingly, as the technology development and demand for mobile devices, electric vehicles, hybrid electric vehicles, power storage devices and uninterruptible power supplies have increased, the demand for secondary batteries as an energy source is rapidly increasing. In particular, secondary batteries used in electric vehicles or hybrid electric vehicles are high-power, high-capacity secondary batteries, and many studies have been conducted thereon.

In addition, along with a great demand for secondary batteries, peripheral components and devices related to secondary batteries have been studied. That is, various parts and devices such as a cell assembly prepared by connecting a plurality of secondary batteries into a single module, a battery management system (BMS) for controlling charge and discharge of the cell assembly and monitoring a state of each secondary battery, a battery pack prepared to include the cell assembly and the BMS into a single pack and a switch for connecting the cell assembly to a load such as a motor are being studied.

In particular, the switch is used to connect a cell assembly and a load and control whether or not to supply power and is being intensively studied. As an example, a lithium ion secondary battery widely used in the art has an operating voltage of about 3.7V to 4.2V. In order to provide a high voltage, a plurality of secondary batteries are connected in series to form the cell assembly.

The power system may include a switch that connects the cell assembly to a motor. In addition, the power system may stably supply power between the battery and a load by selectively opening and closing at least one switch. If the power system is provided in a vehicle, in relation to the safety of the power system, it is important to ensure that the switch is not opened due to a system error but remains closed while the vehicle is running.

Therefore, in the related art, there is a need for a technique that may effectively maintain the switch in a closed state despite a system failure. This requirement increases the complexity of the circuit.

SUMMARY

Technical Problem

The present disclosure is designed to solve the problems of the related art, and therefore the present disclosure is directed to providing an improved switch control apparatus and method, which may diagnose whether a plurality of switches are controllable and effectively control the plurality of switches.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

In one aspect of the present disclosure, there is provided a switch control apparatus, comprising: a first processor configured to output a first control signal for controlling an operation state of a first switch, a second control signal for controlling an operation state of a second switch, and a diagnosis signal; a second processor configured to output a verification signal for verifying the operation states of the first switch and the second switch; a diagnosing unit connected to the first switch through a first control line and connected to the second switch through a second control line to receive the first control signal, the second control signal and the diagnosis signal from the first processor and to receive the verification signal from the second processor, the diagnosing unit being configured to output the verification signal or a third control signal corresponding to the verification signal to each of the first switch and the second switch based on the diagnosis signal and the verification signal; and a voltage sensor configured to measure voltages of the first control line and the second control line and output the measured voltages to the first processor.

The first processor may be configured to detect a signal in each of the first control line and the second control line based on the measured voltages and diagnose whether the first switch and the second switch are controllable based on the detected signal.

The diagnosing unit may include a flip-flop configured to receive the second control signal from the first processor and output a first output value identical to the received second control signal and a second output value that is an inverted value of the first output value.

The diagnosing unit may include a clock signal generator configured to output to the flip-flop a clock signal corresponding to the received diagnosis signal in response to receiving the diagnosis signal from the first processor.

The diagnosing unit may include one or more buffers configured to receive the first output value and the second output value output from the flip-flop, the first control signal and the second control signal output from the first processor, and the verification signal output from the second processor, and to output the first control signal, the second control signal, or one of the verification signal or the third control signal, based on the first output value and the second output value.

The one or more buffers may be a plurality of buffers configured to receive any one of the first output value and the second output value so that each operation state is determined according to respective magnitudes of the received first and second output values.

The buffer unit may include: a first buffer configured to receive the first control signal and the second output value and determine based on the magnitude of the second output value whether or not to output the first control signal; a second buffer and a third buffer configured to receive the verification signal and the first output value; and determine based on the magnitude of the first output value whether or not to output the verification signal or the third control signal; and a fourth buffer configured to receive the second control signal and the second output value and determine based on the magnitude of the second output value whether or not to output the second control signal.

The diagnosing unit may further include a gate connected between the one or more buffers and at least one of the first switch or the second switch and is configured to receive the verification signal from the second processor.

The gate may be configured to output the signal received from the one or more buffers to a connected one of the first switch or the second switch, in response to receiving the verification signal from the second processor.

The first processor may be configured to determine that the first switch and the second switch are controllable, in response to the verification signal being detected in the first control line and the second control line.

The first processor may be configured to output a signal corresponding to a low level signal as the diagnosis signal, and determine that the diagnosing unit operates normally, in response to the detected signal being identical to a previously detected signal.

A battery management system (BMS) according to another aspect of the present disclosure may comprise the switch control apparatus according to any of the embodiments of the present disclosure.

A battery pack according to another aspect of the present disclosure may comprise the switch control apparatus according to any of the embodiments of the present disclosure.

A switch control method according to still another aspect of the present disclosure may comprise: outputting a first control signal for controlling an operation state of a first switch, a second control signal for controlling an operation state of a second switch, and a diagnosis signal; outputting a verification signal for verifying the operation states of the first switch and the second switch; outputting the verification signal or a third control signal corresponding to the verification signal to each of a first control line connected to the first switch and a second control line connected to the second switch based on the diagnosis signal and the verification signal; detecting a signal flowing in the first control line and the second control line; and diagnosing whether the first switch and the second switch are controllable, based on the detected signal.

Advantageous Effects

According to an aspect of the present disclosure, it is possible to effectively maintain the state of the switch through a plurality of processors.

In addition, according to an aspect of the present disclosure, it is possible to effectively check the states of a plurality of switches and maintain the states of the switches through a diagnosing unit.

In particular, according to an embodiment of the present disclosure, an improved switch control apparatus and method capable of effectively maintaining the state of a switch by checking whether the switch control state is normal even at ordinary time may be provided.

The present disclosure may have various effects other than the above, and other effects of the present disclosure may be understood from the following description and more clearly figured out by the embodiments of the present disclosure.

BRIEF DESCRIPTION OF THE DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

DETAILED DESCRIPTION

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

Further, in describing the present disclosure, if it is determined that a detailed description of a related known structure or function may obscure the subject matter of the present disclosure, the detailed description will be omitted.

Throughout the specification, when a portion is referred to as "comprising" or "including" any element, it means that the portion may include other elements further, without excluding other elements, unless specifically stated otherwise. Furthermore, the term "processor" described in the specification refers to a unit that processes at least one function or operation, and may be implemented by hardware, software, or a combination of hardware and software.

In addition, throughout the specification, when a portion is referred to as being "connected" to another portion, it is not limited to the case that they are "directly connected", but it also includes the case where they are "indirectly connected" with another element being interposed between them.

Figure 1:
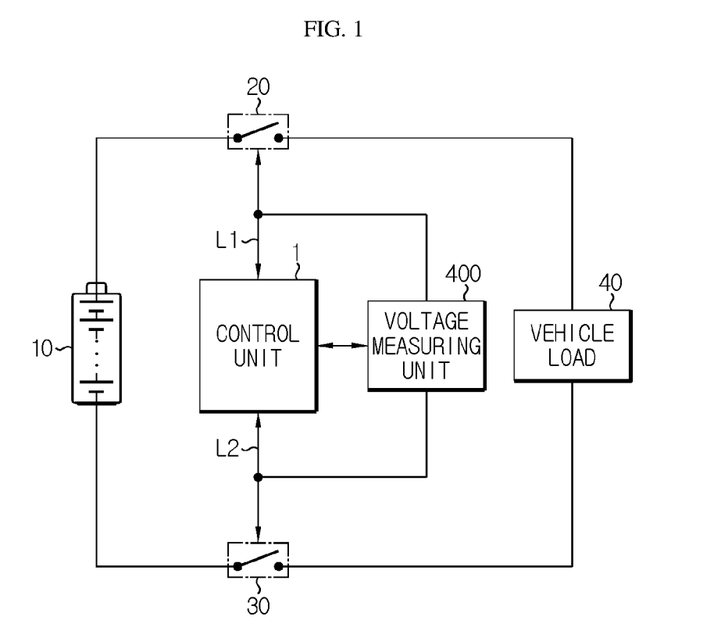
FIG. 1 is a diagram showing a schematic configuration of a battery pack including a switch control apparatus according to an embodiment of the present disclosure.
Figure 2:
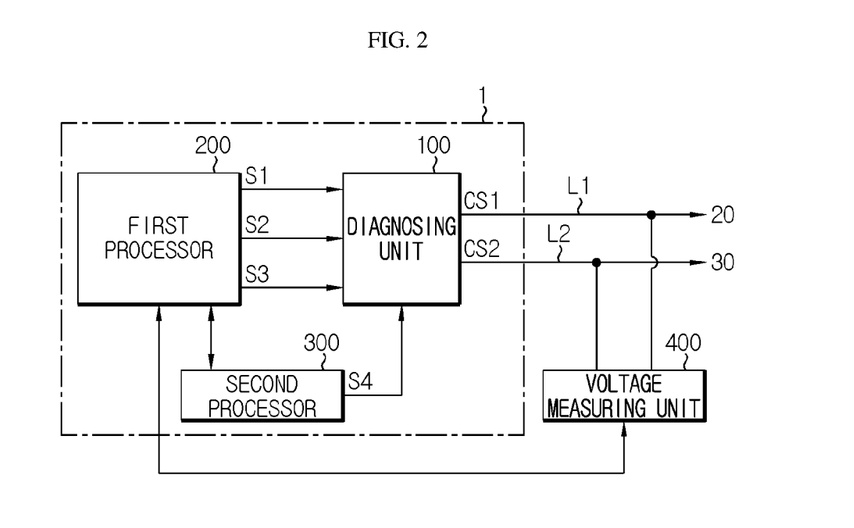
FIG. 2 is a diagram schematically showing a configuration of a switch control apparatus according to an embodiment of the present disclosure.

FIG. 1 is a diagram showing a schematic configuration of a battery pack including a switch control apparatus according to an embodiment of the present disclosure. FIG. 2 is a diagram schematically showing a configuration of a switch control apparatus according to an embodiment of the present disclosure.

Referring to FIG. 1, a switch control apparatus according to an embodiment of the present disclosure may include a control unit 1 and a voltage measuring unit 400. More specifically, referring to FIG. 2, the control unit 1 may include a first processor 200, a second processor 300, and a diagnosing unit 100. That is, the switch control apparatus according to an embodiment of the present disclosure may include a control unit 1 having a first processor 200, a second processor 300 and a diagnosing unit 100, and a voltage measuring unit 400.

In addition, the switch control apparatus according to an embodiment of the present disclosure may be provided in a battery pack. That is, in an embodiment of FIG. 1, the battery pack may include a cell assembly 10, a first switch 20 and a second switch 30, and may be connected to a vehicle load 40.

Here, at least one battery cell may be provided in the cell assembly 10 to be connected in series and/or in parallel. In addition, the battery cell includes a negative electrode terminal and a positive electrode terminal, and refers to one independent cell that is physically separable. For example, one pouch-type lithium polymer cell may be regarded as a battery cell.

In addition, the first switch 20 and the second switch 30 may be switches provided on a charging and discharging path of the cell assembly 10. Here, the charging and discharging path is a path through which a current flows when the cell assembly 10 is charged or discharged, and may be a high current path of a battery pack. For example, the first switch 20 may be provided on a charging and discharging path between the positive electrode terminal of the cell assembly 10 and the vehicle load 40. In addition, the second switch 30 may be provided on a charging and discharging path between the negative electrode terminal of the cell assembly 10 and the vehicle load 40.

For example, in the embodiment of FIG. 1, the switch control apparatus according to an embodiment of the present disclosure may control the opening and closing operations of the first switch 20 and the second switch 30 included in the battery pack. In detail, the switch control apparatus may be connected to the first switch 20 through a first control line L1 and may be connected to the second switch 30 through a second control line L2.

In addition, the switch control apparatus may diagnose whether the first switch 20 and the second switch 30 are controllable. Hereinafter, each component of the switch control apparatus will be described in detail.

The first processor 200 may be configured to output a first control signal S1 for controlling an operation state of the first switch 20, a second control signal S2 for controlling an operation state of the second switch 30, and a diagnosis signal S3.

The first control signal S1 may be a signal output by the first processor 200 to control the opening and closing operation of the first switch 20. The first control signal S1 may be a signal having a voltage value for shifting the operation state of the first switch 20. For example, when a threshold voltage for shifting the first switch 20 to a closed state is 5V, the first control signal S1 may be a signal having a voltage value of 5V in order to shift the first switch 20 to the closed state.

In addition, the second control signal S2 may be a signal output by the first processor 200 to control the opening and closing operation of the second switch 30. The second control signal S2 may be a signal having a voltage value for shifting the operation state of the second switch 30. For example, when a threshold voltage for shifting the second switch 30 to the closed state is 5V, the second control signal S2 may be a signal having a voltage value of 5V for shifting the second switch 30 to the closed state.

The diagnosis signal S3 may be a signal output by the first processor 200 to diagnose whether the control operation for controlling the first switch 20 and the second switch 30 operates normally. For example, if the diagnosis signal S3 is output from the first processor 200, a diagnosis process according to the present disclosure may be performed. Here, the diagnosis signal S3 may be a signal having a predesignated voltage value.

For example, in the embodiment of FIG. 2, the first processor 200 may be electrically connected to the diagnosing unit 100. In addition, the first processor 200 may output the first control signal S1, the second control signal S2 and the diagnosis signal S3 to the diagnosing unit 100.

The second processor 300 may be configured to output a verification signal S4 for verifying an operation state of the first switch 20 and the second switch 30.

The verification signal S4 may be a signal for verifying whether it is possible to control the switches, in the process of diagnosing whether the first switch 20 and the second switch 30 are controllable.

Preferably, the verification signal S4 may be a signal having a predesignated voltage value. More preferably, the verification signal S4 may be a signal having a voltage value different from the first control signal S1 and the second control signal S2.

In the embodiment of FIG. 2, the second processor 300 may be connected to the diagnosing unit 100. In addition, the second processor 300 may output the verification signal S4 to the diagnosing unit 100.

For example, it is assumed that the first control signal S1 and the second control signal S2 are signals having a voltage value of 5V, as in the former embodiment. The verification signal S4 may be a signal having a voltage value of 3V different from the first control signal S1 and the second control signal S2. At this time, preferably, the voltage value of the diagnosis signal S3 may not be limited by the voltage values of the first control signal S1, the second control signal S2 and the verification signal S4.

For example, in the embodiment of FIG. 2, the first processor 200 and the second processor 300 may be connected to each other. The first processor 200 may command the second processor 300 to output the verification signal S4, and the second processor 300 receiving the command may output the verification signal S4.

As another example, the second processor 300 may output the verification signal S4 to the diagnosing unit 100 even if the second processor 300 does not receive a command for outputting the verification signal S4 from the first processor 200.

The diagnosing unit 100 may be configured to be connected to the first switch 20 through a first control line L1 and connected to the second switch 30 through a second control line L2. That is, the control unit 1 may be connected to the first switch 20 and the second switch 30 through the diagnosing unit 100.

For example, in the embodiment of FIG. 2, the diagnosing unit 100 may be connected to the first switch 20 through the first control line L1 and may be connected to the second switch 30 through the second control line L2.

The diagnosing unit 100 may be configured to receive the first control signal S1, the second control signal S2 and the diagnosis signal S3 from the first processor 200, and receive the verification signal S4 from the second processor 300.

For example, in the embodiment of FIG. 2, the diagnosing unit 100 may be connected to the first processor 200 and the second processor 300. In addition, the diagnosing unit 100 may receive the first control signal S1, the second control signal S2 and the diagnosis signal S3 from the first processor 200. Also, the diagnosing unit 100 may receive the verification signal S4 from the second processor 300.

The diagnosing unit 100 may be configured to output the verification signal S4 or a corresponding control signal to the first switch 20 and the second switch 30, respectively, based on the diagnosis signal S3 and the verification signal S4.

In detail, the diagnosing unit 100 may output the first control signal S1 and the second control signal S2, or the verification signal S4, according to the diagnosis signal S3 and the verification signal S4. More specifically, the diagnosing unit 100 may output the first control signal S1 or the verification signal S4 to the first switch 20 and output the second control signal S2 or the verification signal S4 to the second switch 30 according to the diagnosis signal S3 and the verification signal S4.

For example, in the embodiment of FIG. 2, the diagnosing unit 100 may output a first output signal CS1 to the first switch 20 and output a second output signal CS2 to the second switch 30. Here, the first output signal CS1 may be the first control signal S1 or the verification signal S4. In addition, the second output signal CS2 may be the second control signal S2 or the verification signal S4.

The voltage measuring unit 400 may be configured to measure the voltages of the first control line L1 and the second control line L2.

In detail, the voltage measuring unit 400 may be electrically connected to the first control line L1 and the second control line L2 to measure the voltages of the first control line L1 and the second control line L2, respectively. More specifically, the voltage measuring unit 400 may measure the voltages of the first control line L1 and the second control line L2 based on the electric signals received from the first control line L1 and the second control line L2, respectively.

For example, in the embodiments of FIGS. 1 and 2, the voltage measuring unit 400 may be electrically connected to the first control line L1 and the second control line L2, respectively. In addition, the voltage measuring unit 400 may measure the voltages of the first control line L1 and the second control line L2.

In addition, the voltage measuring unit 400 may be configured to output the plurality of measured voltage values to the first processor 200.

In detail, the voltage measuring unit 400 may be electrically connected to the first processor 200 to transmit and receive an electric signal. Preferably, the voltage measuring unit 400 may measure a potential difference between the first and second control lines L1, L2 and a reference ground at time intervals under the control of the first processor 200, and send a signal indicating the measured voltage value to the first processor 200. The voltage measuring unit 400 may be implemented using a voltage measuring circuit commonly used in the art.

For example, in the embodiments of FIGS. 1 and 2, the voltage measuring unit 400 may output the measured voltage value of the first control line L1 and the measured voltage value of the second control line L2 to the first processor 200.

The first processor 200 may be configured to detect a signal flowing in each of the first control line L1 and the second control line L2 based on the plurality of voltage values measured by the voltage measuring unit 400.

As described above, the voltage values of the first control signal S1 and the second control signal S2 are set to be identical, and the voltage values of the first control signal S1 and the verification signal S4 may be set to be different from each other. Therefore, the first processor 200 may detect the type of the signal flowing in the first control line L1 based on the voltage value of the first control line L1 received from the voltage measuring unit 400. In addition, the first processor 200 may detect the type of a signal flowing in the second control line L2 based on the voltage value of the second control line L2 received from the voltage measuring unit 400.

For example, as in the former embodiment, it is assumed that the voltage value of the first control signal S1 and the second control signal S2 is 5V, and the voltage value of the verification signal S4 is 3V. If the voltage value of the first control line L1 and the voltage value of the second control line L2 received by the first processor 200 from the voltage measuring unit 400 are 3V, the first processor 200 may determine that the verification signal S4 flows through the first control line L1 and the second control line L2. That is, the first processor 200 may determine that both the first output signal CS1 and the second output signal CS2 output from the diagnosing unit 100 are the verification signal S4.

The first processor 200 may be configured to diagnose whether the first switch 20 and the second switch 30 are controllable, based on the detected signal.

Specifically, the first processor 200 may be configured to determine that the first switch 20 and the second switch 30 are controllable when the verification signal S4 is detected in the first control line L1 and the second control line L2.

For example, it is assumed that the first processor 200 outputs the first control signal S1, the second control signal S2 and the diagnosis signal S3 to the diagnosing unit 100, and commands the second processor 300 to output the verification signal S4. The diagnosing unit 100 may receive the first control signal S1, the second control signal S2 and the diagnosis signal S3 from the first processor 200, and receive the verification signal S4 from the second processor 300. In addition, the diagnosing unit 100 may output the verification signal S4 as the first output signal CS1 and output the verification signal S4 as the second output signal CS2, based on the voltage values of the received verification signal S4 and the received diagnosis signal S3. The first processor 200 may detect that the verification signal S4 flows in the first control line L1 and the second control line L2, according to the plurality of voltage values measured by the voltage measuring unit 400 (the voltage value of the first control line L1 and the voltage value of the second control line L2). In this case, the first processor 200 may determine that the first switch 20 and the second switch 30 are controllable.

As another example, it is assumed that the first control signal S1 is output as the first output signal CS1 of the diagnosing unit 100 and the second control signal S2 is output as the second output signal CS2. In this case, the first control signal S1 may be input to the first switch 20, and the second control signal S2 may be input to the second switch 30. As a result, the operation state of the first switch 20 may be controlled so as to correspond to the first control signal S1, and the operation state of the second switch 30 may be controlled so as to correspond to the second control signal S2.

The switch control apparatus according to an embodiment of the present disclosure has an advantage of diagnosing whether the plurality of switches 20, 30 can be normally controlled based on the output result of the diagnosing unit 100 that receives a plurality of signals. As a result, by diagnosing whether or not the switches are normally controllable, the switch control apparatus has an advantage of preventing an accident that may unexpectedly occur in a situation where the switches cannot be normally controlled.

Hereinafter, the configuration of the diagnosing unit 100 will be described in more detail with reference to FIG. 3.

Figure 3:
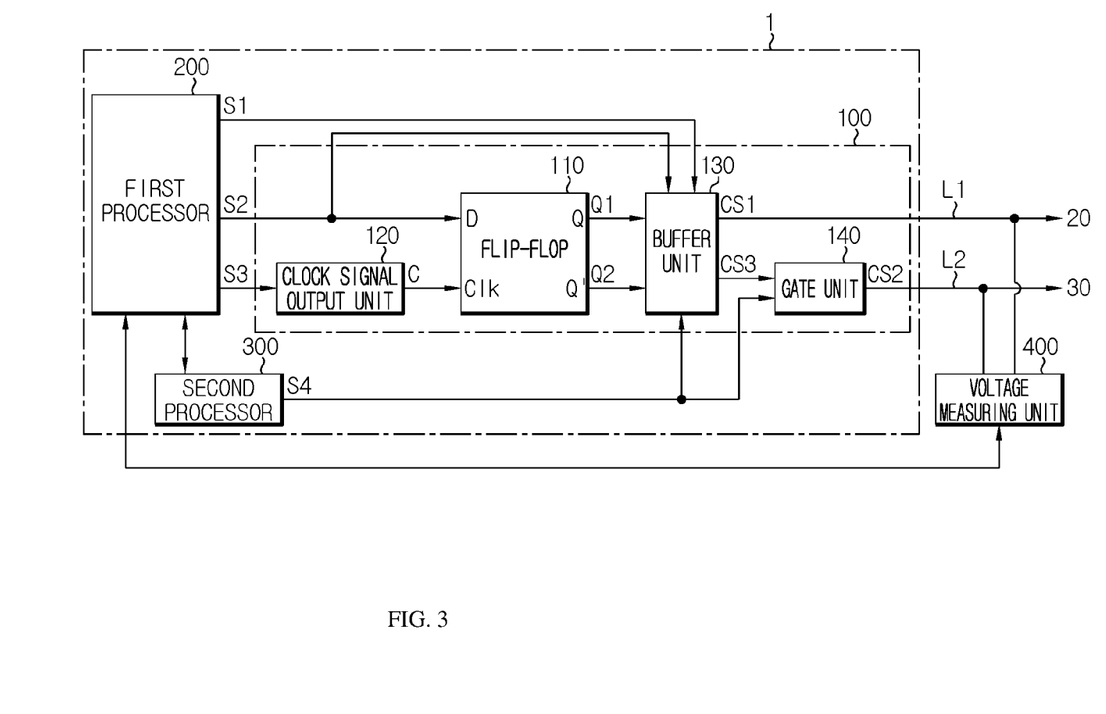
FIG. 3 is a diagram showing the configuration of the switch control apparatus according to an embodiment of the present disclosure in detail.

FIG. 3 is a diagram showing the configuration of the switch control apparatus according to an embodiment of the present disclosure in detail.

Referring to FIG. 3, the diagnosing unit 100 may include a clock signal output unit 120, a flip-flop 110, a buffer unit 130, and a gate unit 140.

Here, the flip-flop 110 may be a logic circuit capable of storing and maintaining one bit information. For example, the flip-flop 110 may be a D flip-flop that maintains a data signal input through a data terminal D at an instant edge of a clock signal C input through a clock terminal Clk. In addition, the flip-flop 110 may be a RS flip-flop, a JK flip-flop or a T flip-flop. Hereinafter, for convenience of description, it is described that flip-flop 110 is a D flip-flop.

The clock signal output unit 120 may be configured to receive the diagnosis signal S3 from the first processor 200.

For example, in the embodiment of FIG. 3, the first processor 200 and the clock signal output unit 120 may be connected. In addition, the diagnosis signal S3 output from the first processor 200 may be input to the clock signal output unit 120.

The clock signal output unit 120 may be configured to output the clock signal C corresponding to the received diagnosis signal S3 to the flip-flop 110.

Preferably, when receiving the diagnosis signal S3 from the first processor 200, the clock signal output unit 120 may be configured to output a clock signal C corresponding to the magnitude (a signal level) of the received diagnosis signal S3.

For example, in the embodiment of FIG. 3, the clock signal C output from the clock signal output unit 120 may be input to the clock terminal Clk of the flip-flop 110.

However, even though FIG. 3 shows an embodiment in which the clock signal output unit 120 is provided in the diagnosing unit 100, preferably, the clock signal output unit 120 may be selectively provided in the diagnosing unit 100. That is, the clock signal output unit 120 may not be provided in the diagnosing unit 100 of another embodiment. In this case, the diagnosis signal S3 output from the first processor 200 may be a clock signal C. For example, the diagnosis signal S3 output from the first processor 200 may be input to the clock terminal Clk of the flip-flop 110.

The flip-flop 110 may be configured to receive the second control signal S2 from the first processor 200. That is, the flip-flop 110 may receive the second control signal S2 through the data terminal D and receive the clock signal C through the clock terminal Clk.

The flip-flop 110 may be configured to output a first output value Q1 identical to the received second control signal S2 and a second output value Q2 that is an inverted value of the first output value Q1, respectively.

Figure 4:
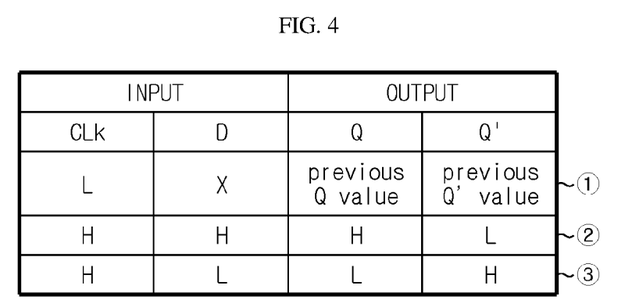
FIG. 4 is a diagram showing a truth table of a flip-flop provided to the switch control apparatus according to an embodiment of the present disclosure.

FIG. 4 is a diagram showing a truth table of a flip-flop 110 provided to the switch control apparatus according to an embodiment of the present disclosure.

In the truth table of the flip-flop 110 as shown in FIG. 4, H means that a high level signal is input to clock terminal Clk or data terminal D. L means that a low level signal is input to the clock terminal Clk or the data terminal D. Alternatively, L means that no signal is input to the clock terminal Clk or the data terminal D. X means that there is no relation with the input of the second control signal S2 to the data terminal D. That is, if the clock signal C is L, the output result of the flip-flop 110 may be independent of the second control signal S2 input to the data terminal D.

For example, in the truth table of FIG. 4, ① is a case where the clock signal C, which is a low level signal, is input to the clock terminal Clk. ② is a case where the clock signal C, which is a high level signal, is input to the clock terminal Clk and the second control signal S2, which is a high level signal, is input to the data terminal D. ③ is a case where the clock signal C, which is a high level signal, is input to the clock terminal Clk, and the second control signal S2, which is a low level signal, is input to the data terminal D.

In addition, the signals output from the first output terminal Q and the second output terminal Q' may be changed depending on the level of the clock signal C input to the clock terminal Clk of the flip-flop 110.

For example, in the case of ① shown in FIG. 4, the flip-flop 110 may output the first output value Q1, which is output at a previous sequence, through the first output terminal Q, and output the second output value Q2, which is output at the previous sequence, through the second output terminal Q'.

In another example, in the case of ② shown in FIG. 4, the flip-flop 110 may output the first output value Q1, which is the same value as the second control signal S2, through the first output terminal Q, and may output the second output value Q2, which is an inverted value of the first output value Q1, through the second output terminal Q'.

In still another example, in the case of ③ shown in FIG. 4, the flip-flop 110 may output the first output value Q1, which is an inverted value of the second control signal S2, through the first output terminal Q, and may output the second output value Q2, which is an inverted value of the first output value Q1, through the second output terminal Q'.

In the embodiment of FIG. 1, it is assumed that the operation states of the first switch 20 and the second switch 30 are turn-on states, and the vehicle load 40 is powered from the cell assembly 10. If the operation state of the first switch 20 or the second switch 30 is turned off unexpectedly, the power supplied to the vehicle load 40 is suddenly cut off, which may damage the vehicle. Also in this case, an accident may occur as the vehicle suddenly turns off.

If the operation state of the first switch 20 or the second switch 30 is suddenly shifted to a turn-off state, the first processor 200 may be unexpectedly terminated. That is, if the first processor 200 suddenly shuts down, the first control signal S1 and the second control signal S2 may not be input to the diagnosing unit 100. In this case, in order to prevent the operation states of the first switch 20 and the second switch 30 from being shifted to the turn-off state, the flip-flop 110 may be operated. That is, if the first processor 200 suddenly shuts down, this means that the situation ① occurs in the truth table of FIG. 4, and the flip-flop 110 may maintain the first output value Q1 and the second output value Q2 previously output. That is, the signal output from the diagnosing unit 100 is maintained identically while the first processor 200 is reset, thereby preventing a sudden change in the driving power of a load such as a vehicle that includes the battery pack. After that, if the first processor 200 is reset to output the first control signal S1 and the second control signal S2, the operation states of the first switch 20 and the second switch 30 may be maintained in the turn-on state.

That is, since the switch control apparatus according to an embodiment of the present disclosure includes the diagnosing unit 100 having the flip-flop 110, the operation state of the plurality of switches 20, 30 may be maintained even though the first main relay is unexpectedly reset. Therefore, there is an advantage that an accident caused by an unexpected shifting of the operation state of the switch may be prevented in advance.

The buffer unit 130 may be configured to receive the first output value Q1 and the second output value Q2 output from the flip-flop 110, the first control signal S1 and the second control signal S2 output from the first processor 200, and the verification signal S4 output from the second processor 300.

For example, in the embodiment of FIG. 3, the buffer unit 130 may receive the first control signal S1 and the second control signal S2 from the first processor 200. In addition, the buffer unit 130 may receive the verification signal S4 from the second processor 300. Also, the buffer unit 130 may receive the first output value Q1 output from the first output terminal Q of the flip-flop 110 and the second output value Q2 output from the second output terminal Q'.

In addition, the buffer unit 130 may be configured to output the first control signal S1 and the second control signal S2, or the verification signal S4, according to the first output value Q1 and the second output value Q2.

Preferably, the buffer unit 130 may output the first control signal S1 or the verification signal S4 as the first output signal CS1 and output the second control signal S2 or the verification signal S4 as a third output signal CS3 according to the magnitude (the signal level) of the first output value Q1 and the second output value Q2.

More preferably, when outputting the first control signal S1 as the first output signal CS1, the buffer unit 130 may output the second control signal S2 as the third output signal CS3. In addition, when outputting the verification signal S4 as the first output signal CS1, the buffer unit 130 may output the verification signal S4 as the third output signal CS3.

More specifically, the buffer unit 130 may be configured to include a plurality of buffers.

The plurality of buffers included in the buffer unit 130 may be configured to receive any one of the first output value Q1 and the second output value Q2 and to determine the operation state of each switch according to the magnitude of the input output value.

The first output value Q1 or the second output value Q2 output from the flip-flop 110 may be input to the plurality of buffers. In addition, the first output value Q1 or the second output value Q2 may correspond to an operating power of the corresponding buffer. For example, a buffer receiving a high level signal may be operated, and a buffer receiving a low level signal may not be operated.

That is, the operation state of the plurality of buffers included in the buffer unit 130 may be determined according to the output result of the flip-flop 110. In detail, since the output result of the flip-flop 110 is affected by the clock signal C input to the flip-flop 110, the operation state of the plurality of buffers may be determined based on the diagnostic state output from the first processor 200.

For example, the buffer unit 130 may include a first buffer, a second buffer, a third buffer, and a fourth buffer.

The first buffer may be configured to receive the first control signal S1 and the second output value Q2, and determine whether to output the first control signal S1 according to the magnitude (the signal level) of the second output value Q2.

The second buffer and the third buffer may be configured to receive the verification signal S4 and the first output value Q1, and determine whether to output the verification signal S4 according to the magnitude (the signal level) of the first output value Q1.

The fourth buffer may be configured to receive the second control signal S2 and the second output value Q2, and to determine whether to output the second control signal S2 according to the magnitude (the signal level) of the second output value Q2.

The gate unit 140 may be configured to be connected between at least one of the first switch 20 and the second switch 30 and the buffer unit 130.

In detail, the gate unit 140 may serve as a buffer. Preferably, the verification signal S4 output from the second processor 300 may be a signal having a delay time. That is, the second processor 300 may be configured to determine a signal delay time and to generate and output a verification signal S4 having the determined signal delay time. For example, the second processor 300 may determine the signal delay time as 3 seconds and generate and output a verification signal S4 having the determined delay time of 3 seconds. In addition, if the verification signal S4 is input to the gate unit 140, it may take 3 seconds until the signal is output from the gate unit 140.

Preferably, the diagnosing unit 100 may include at least one gate unit 140. That is, the gate unit 140 may be disposed on the first control line L1 and/or the second control line L2. Since the gate unit 140 functions as a buffer, a signal delay as much as a time set in the verification signal S4 may be generated in the control line on which the gate unit 140 is disposed.

For example, while a signal delay occurs in the gate unit 140, the operation state of the switch connected to the gate unit 140 may be maintained. Therefore, as in the former example, even when the first processor 200 is suddenly reset, the operation state of the switch may be maintained by the previous signal maintenance by the flip-flop 110 and the signal delay by the gate unit 140.

Hereinafter, for convenience of explanation, it will be described that the gate unit 140 is disposed only on the second control line L2 as in the embodiment of FIG. 3.

For example, the gate unit 140 of FIG. 3 may be connected between the buffer unit 130 and the second switch 30 to receive the third output signal CS3 from buffer unit 130. In addition, the gate unit 140 may output the second output signal CS2 to the second control line L2.

As a specific example, the first buffer and the second buffer included in the buffer unit 130 may be connected to the first control line L1, and the third buffer and the fourth buffer may be connected to the gate unit 140 disposed on the second control line L2. As another example, if the gate unit 140 is provided only in the first control line L1, the first buffer and the second buffer included in the buffer unit 130 may be connected to the gate unit 140 disposed on the first control line L1, and the third buffer and the fourth buffer may be connected to the second control line L2.

In addition, the gate unit 140 may be configured to receive the verification signal S4 from the second processor 300.

Preferably, the gate unit 140 may be configured to output the third output signal CS3 received from the buffer unit 130 to the second control line L2 when the verification signal S4 is input from the second processor 300.

That is, if the gate unit 140 receives the verification signal S4 from the second processor 300, the gate unit 140 may output the third output signal CS3 received from the buffer unit 130 as the second output signal CS2. In this case, the second output signal CS2 output through the second control line L2 by the diagnosing unit 100 may be the third output signal CS3 output to the gate unit 140 by the buffer unit 130.

For example, in the embodiment of FIG. 3, if the gate unit 140 receives the verification signal S4 which is a high level signal, the gate unit 140 may output the second control signal S2 or the verification signal S4 received from the buffer unit 130 to the second control line L2. On the contrary, if the gate unit 140 receives the verification signal S4 which is a low level signal, the gate unit 140 may not output the second control signal S2 or the verification signal S4 received from the buffer unit 130 to the second control line L2.

For example, it is assumed that the first output signal CS1 output from the buffer unit 130 is the first control signal S1 and the third output signal CS3 is the second control signal S2. The first output signal CS1 output from the buffer unit 130 may be input to the first switch 20 through the first control line L1. In addition, if the verification signal S4 is a high level signal, the third output signal CS3 output from the buffer unit 130 may be input to the second switch 30 through the gate unit 140 and the second control line L2.

As another example, it is assumed that both the first output signal CS1 and the third output signal CS3 output from the buffer unit 130 are the verification signal S4. The first output signal CS1 output from the buffer unit 130 may be input to the first switch 20 through the first control line L1. If the verification signal S4 is a high level signal, the third output signal CS3 output from the buffer unit 130 may be input to the second switch 30 through the gate unit 140 and the second control line L2.

Hereinafter, an embodiment in which the first processor 200 determines whether the diagnosing unit 100 operates normally will be described on the assumption of a reset situation.

The first processor 200 may be configured to output a signal corresponding to a low level signal as the diagnosis signal S3.

That is, the first processor 200 may output the diagnosis signal S3 corresponding to a low level signal in order to assume a reset situation. Seeing the truth table of FIG. 4, since the first processor 200 assumes a reset situation in order to diagnose whether the output of the diagnosing unit 100 is maintained in case of ①, the first processor 200 may output the diagnosis signal S3 corresponding to a low level signal.

After that, the first processor 200 may be configured to determine that the diagnosing unit 100 operates normally, if the signal detected in each of the first control line L1 and the second control line L2 is the same as the signal detected in the previous detection process.

Preferably, when the diagnosing unit 100 operates normally, if the diagnosis signal S3 output from the first processor 200 is a low level signal, the same signal as detected in the previous signal detection process may be detected in the first control line L1 and the second control line L2.

For example, it is assumed that the verification signal S4 is detected in the first control line L1 and the second control line L2 during the previous signal detection process. If the first processor 200 outputs a low level signal as the diagnosis signal S3, the first output value Q1 and the second output value Q2 output from the flip-flop 110 may be the same as the values output from the flip-flop 110 during the previous signal detection process. In addition, the verification signal S4 output from the second processor 300 may flow on the first control line L1 and the second control line L2 through the buffer unit 130 and the gate unit 140. Preferably, the signal level of the verification signal S4 may have a size capable of keeping the operation states of the first switch 20 and the second switch 30 in the turn-on state. Therefore, if the first processor 200 outputs a low level signal, namely even when the first processor 200 is reset, the operation states of the first switch 20 and the second switch 30 may be maintained.

Therefore, after outputting the diagnosis signal S3 corresponding to a low level signal, the first processor 200 may determine that the diagnosing unit 100 operates normally if the same signal are detected in the previous signal detection process and in the current signal detection process. In this case, since the diagnosing unit 100 operates normally, the first processor 200 may determine that the first switch 20 and the second switch 30 connected to the diagnosing unit 100 are normally controllable.

That is, the switch control apparatus according to an embodiment of the present disclosure may determine whether the plurality of switches 20, 30 are controllable according to whether the verification signal S4 is detected in the first control line L1 and the second control line L2. Also, it may be further determined whether the plurality of switches 20, 30 are controllable on the assumption that the first processor 200 is reset. Accordingly, the switch control apparatus may diagnose whether the diagnosing unit 100 is normally operated and whether the plurality of switches 20, 30 are controllable in various aspects.

Accordingly, since the switch control apparatus ensures the normal operation of the diagnosing unit 100 and the normal control of the switches based on the diagnosis result, even in an unexpected situation such as the reset of the first processor 200, the operation states of the plurality of switch 20, 30 may be maintained. Therefore, accidents that may occur due to unexpected shifting of the operation states of the plurality of switches 20, 30 may be prevented in advance.

The switch control apparatus according to the present disclosure may be applied to a battery management system (BMS). That is, the BMS according to the present disclosure may include the switch control apparatus of the present disclosure as described above. In this configuration, at least a part of the components of the switch control apparatus according to the present disclosure may be implemented by supplementing or adding functionality of components included in the conventional BMS. For example, the processor and the memory device of the switch control apparatus according to the present disclosure may be implemented as components of the BMS.

In addition, the switch control apparatus according to the present disclosure may be provided to a battery pack. For example, the switch control apparatus according to an embodiment of the present disclosure as shown in FIG. 1 may be included in a battery pack. Here, the battery pack may further include electrical components (a BMS, a relay, a fuse, and the like), and a case.

Figure 5:
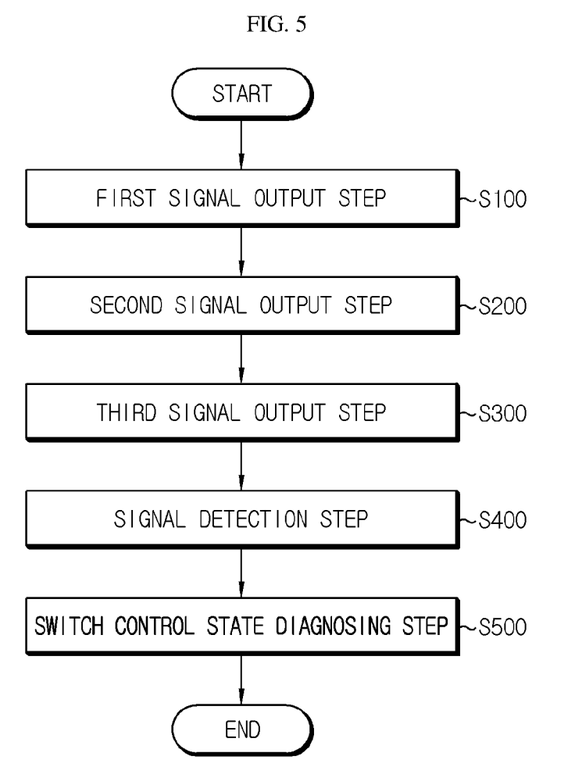
FIG. 5 is a flowchart schematically showing a switch control method according to another embodiment of the present disclosure.

FIG. 5 is a flowchart schematically showing a switch control method according to another embodiment of the present disclosure. Each step of the switch control method may be performed by the switch control apparatus.

Referring to FIG. 5, the switch control method according to another embodiment of the present disclosure may include a first signal output step (S100), a second signal output step (S200), a third signal output step (S300), a signal detection step (S400) and switch control state diagnosing step (S500).

The first signal output step (S100) is a step of outputting a first control signal S1 for controlling the operation state of the first switch 20, a second control signal S2 for controlling the operation state of the second switch 30, and a diagnosis signal S3, and the first signal output step (S100) may be performed by the first processor 200.

Referring to FIG. 2, the first processor 200 may output the first control signal S1, the second control signal S2 and the diagnosis signal S3 to the diagnosing unit 100.

More specifically, referring to FIG. 3, the first processor 200 may output the first control signal S1 to the buffer unit 130, output the second control signal S2 to the flip-flop 110 and the buffer unit 130, and output the diagnosis signal S3 to the clock signal output unit 120.

As another example, if the clock signal output unit 120 is not provided in the diagnosing unit 100, the first processor 200 may output the diagnosis signal S3 to the flip-flop 110, and the output diagnosis signal S3 may be input to the clock terminal Clk.

The second signal output step (S200) is a step of outputting the verification signal S4 for verifying the operation states of the first switch 20 and the second switch 30, and the second signal output step (S200) may be performed by the second processor 300.

Referring to FIG. 2, the second processor 300 may output the verification signal S4 to the diagnosing unit 100.

More specifically, referring to FIG. 3, the second processor 300 may output the verification signal S4 to the buffer unit 130 and the gate unit 140.

The third signal output step (S300) is a step of outputting the verification signal S4 or a corresponding control signal to the first control line L1 connected to the first switch 20 and the second control line L2 connected to the second switch 30, respectively, based on the diagnosis signal S3 and the verification signal S4, and the third signal output step (S300) may be performed by the diagnosing unit 100.

In the embodiment of FIG. 3, the flip-flop 110 included in the diagnosing unit 100 may output the first output value Q1 at the first output terminal Q and output the second output value Q2 at the second output terminal Q', based on the second control signal S2 input to the data terminal D and the clock signal C input to the clock terminal Clk.

Also, in the embodiment of FIG. 3, the buffer unit 130 included in the diagnosing unit 100 may output the first control signal S1 or the verification signal S4 to the first control line L1 connected to the first switch 20, based on the signal level of the first output value Q1 and the second output value Q2 received from the flip-flop 110. In addition, the buffer unit 130 may output the second control signal S2 or the verification signal S4 to the gate unit 140, based on the signal levels of the first output value Q1 and the second output value Q2 received from the flip-flop 110.

Also, in the embodiment of FIG. 3, the gate unit 140 included in the diagnosing unit 100 may output the signal received from the buffer unit 130 to the second control line L2 connected to the second switch 30, based on the verification signal S4 received from the second processor 300. In this case, if the gate unit 140 receives the second control signal S2 from the buffer unit 130, the second control signal S2 may be output to the second control line L2. On the contrary, if the gate unit 140 receives the verification signal S4 from the buffer unit 130, the verification signal S4 may be output to the second control line L2.

For example, the verification signal S4 may be output to both the first control line L1 and the second control line L2, or alternatively, the first control signal S1 may be output to the first control line L1 and the second control signal S2 may be output to the second control line L2.

The signal detection step (S400) is a step of detecting a signal flowing in the first control line L1 and the second control line L2, and the signal detection step (S400) may be performed by the first processor 200.

First, the voltage measuring unit 400 may measure a voltage of each of the first control line L1 and the second control line L2 and transmit the measured voltage value to the first processor 200.

The first processor 200 may detect a signal flowing in the first control line L1 by checking the signal level of the voltage value of the first control line L1 received from the voltage measuring unit 400. In addition, the first processor 200 may detect a signal flowing in the second control line L2 by checking the signal level of the voltage value of the second control line L2 received from the voltage measuring unit 400.

The switch control state diagnosing step (S500) is a step of diagnosing whether the first switch 20 and the second switch 30 are be controllable based on the signal detected in the signal detection step (S400), and the switch control state diagnosing step (S500) may be performed by the first processor 200.

Preferably, if the signal flowing in the first control line L1 and the second control line L2 is detected as the verification signal S4 by the first processor 200, the first processor 200 may diagnose that the first switch 20 and the second switch 30 are normally controllable.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

REFERENCE SIGNS

1: control unit
10: cell assembly
20: first switch
30: second switch
40: vehicle load
100: diagnosing unit
110: flip-flop
120: clock signal output unit
130: buffer unit
140: gate unit
200: first processor
300: second processor
400: voltage measuring unit

What is claimed is:
1. A switch control apparatus, comprising:
a first processor configured to output a first control signal for controlling an operation state of a first switch, a second control signal for controlling an operation state of a second switch, and a diagnosis signal;

a second processor configured to output a verification signal for verifying the operation states of the first switch and the second switch;

a diagnosing unit connected to the first switch through a first control line and connected to the second switch through a second control line to receive the first control signal, the second control signal and the diagnosis signal from the first processor and to receive the verification signal from the second processor, the diagnosing unit being configured to output the verification signal or a third control signal corresponding to the verification signal to each of the first switch and the second switch based on the diagnosis signal and the verification signal; and a voltage sensor configured to measure voltages of the first control line and the second control line and output the measured voltages to the first processor, wherein the first processor is configured to detect a signal in each of the first control line and the second control line based on the measured voltages and diagnose whether the first switch and the second switch are controllable based on the detected signal.

2. The switch control apparatus according to claim 1, wherein the diagnosing unit includes a flip-flop configured to receive the second control signal from the first processor and output a first output value identical to the received second control signal and a second output value that is an inverted value of the first output value.

3. The switch control apparatus according to claim 2, wherein the diagnosing unit includes a clock signal generator configured to output to the flip-flop a clock signal corresponding to the received diagnosis signal in response to receiving the diagnosis signal from the first processor.

4. The switch control apparatus according to claim 2, wherein the diagnosing unit includes one or more buffers configured to receive the first output value and the second output value output from the flip-flop, the first control signal and the second control signal output from the first processor, and the verification signal output from the second processor, and to output the first control signal, the second control signal, or one of the verification signal or the third control signal, based on the first output value and the second output value.

5. The switch control apparatus according to claim 4, wherein the one or more buffers are a plurality of buffers configured to receive any one of the first output value and the second output value so that each operation state is determined according to the respective magnitudes of the received first and second output values.

6. The switch control apparatus according to claim 5, wherein the plurality of buffers includes:
a first buffer configured to:
receive the first control signal and the second output value; and
determine based on the magnitude of the second output value whether or not to output the first control signal;
a second buffer and a third buffer configured to:
receive the verification signal and the first output value; and
determine based on the magnitude of the first output value whether or not to output the verification signal or the third control signal; and
a fourth buffer configured to:
receive the second control signal and the second output value; and
determine based on the magnitude of the second output value whether or not to output the second control signal.

7. The switch control apparatus according to claim 5, wherein the diagnosing unit further includes a gate connected between the one or more buffers and at least one of the first switch or the second switch and is configured to receive the verification signal from the second processor.

8. The switch control apparatus according to claim 7, wherein the gate is configured to output the signal received from the one or more buffers to a connected one of the first switch or the second switch, in response to receiving the verification signal from the second processor.

9. The switch control apparatus according to claim 1, wherein the first processor is configured to determine that the first switch and the second switch are controllable, in response to the verification signal being detected in the first control line and the second control line.

10. The switch control apparatus according to claim 1, wherein the first processor is configured to:
output a signal corresponding to a low level signal as the diagnosis signal; and
determine that the diagnosing unit operates normally, in response to the detected signal being identical to a previously detected signal.

11. A battery management system (BMS), comprising the switch control apparatus according to claim 1.

12. A battery pack, comprising the switch control apparatus according to claim 1.

13. A switch control method, comprising:
outputting a first control signal for controlling an operation state of a first switch, a second control signal for controlling an operation state of a second switch, and a diagnosis signal;
outputting a verification signal for verifying the operation states of the first switch and the second switch;
outputting the verification signal or a third control signal corresponding to the verification signal to each of a first control line connected to the first switch and a second control line connected to the second switch based on the diagnosis signal and the verification signal;
detecting a signal flowing in the first control line and the second control line; and
diagnosing whether the first switch and the second switch are controllable, based on the detected signal.

* * * * *